(12) United States Patent
Duan

(10) Patent No.: US 11,511,481 B2
(45) Date of Patent: Nov. 29, 2022

(54) MANUFACTURING METHOD AND MANUFACTURING SYSTEM OF PEROVSKITE COLOR CONVERSION FILM

(71) Applicant: SHENZHEN CHINA STAR OPTOELECTRONICS SEMICONDUCTOR DISPLAY TECHNOLOGY CO., LTD., Guangdong (CN)

(72) Inventor: Miao Duan, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 378 days.

(21) Appl. No.: 16/624,207

(22) PCT Filed: Dec. 3, 2019

(86) PCT No.: PCT/CN2019/122657
§ 371 (c)(1),
(2) Date: Dec. 18, 2019

(87) PCT Pub. No.: WO2021/088171
PCT Pub. Date: May 14, 2021

(65) Prior Publication Data
US 2021/0331375 A1    Oct. 28, 2021

(30) Foreign Application Priority Data

Nov. 6, 2019    (CN) .......................... 201911077927.4

(51) Int. Cl.
*B29C 64/118*    (2017.01)
*B33Y 10/00*    (2015.01)
(Continued)

(52) U.S. Cl.
CPC .......... *B29C 64/118* (2017.08); *B29C 64/209* (2017.08); *B33Y 10/00* (2014.12);
(Continued)

(58) Field of Classification Search
CPC ... B29C 64/118; B29C 64/209; B29C 64/393; B33Y 10/00; B33Y 30/00; B33Y 70/00;
(Continued)

(56) References Cited

U.S. PATENT DOCUMENTS 10,978,517 B2    4/2021    Zhou
2018/0126620 A1*    5/2018    Talgorn ................. B29C 48/147
(Continued)

FOREIGN PATENT DOCUMENTS

CN    105552234 A    5/2016
CN    107666999 A    2/2018
(Continued)

OTHER PUBLICATIONS

Adhikari, G. C., Thapa, S., Zhu, H., Zhu, P., Mg2+-Alloyed All-Inorganic Halide Perovskites for White Light-Emitting Diodes by 3D-Printing Method. Adv. Optical Mater. 2019, 7, 1900916.*

*Primary Examiner* — Larry W Thrower
(74) *Attorney, Agent, or Firm* — Geoffrey Lottenberg; Berger Singerman LLP

(57) ABSTRACT

A manufacturing method and a manufacturing system of perovskite color conversion film are provided. The manufacturing method includes: manufacturing perovskite plastic wires; providing a substrate with areas to be printed; and heating and printing the plastic wires on the areas to be printed of the substrate by used of fused deposition modeling 3D printing technology, to formed a perovskite color conversion film.

9 Claims, 3 Drawing Sheets

(51) Int. Cl.
*B33Y 30/00* (2015.01)
*B33Y 70/00* (2020.01)
*B33Y 80/00* (2015.01)
*B29C 64/209* (2017.01)
*B33Y 50/02* (2015.01)
*B29C 64/393* (2017.01)
*B29K 91/00* (2006.01)
*B29K 509/02* (2006.01)
*B29L 11/00* (2006.01)

(52) U.S. Cl.
CPC ............... *B33Y 30/00* (2014.12); *B33Y 70/00* (2014.12); *B33Y 80/00* (2014.12); *B29C 64/393* (2017.08); *B29K 2091/00* (2013.01); *B29K 2509/02* (2013.01); *B29L 2011/00* (2013.01); *B33Y 50/02* (2014.12)

(58) Field of Classification Search
CPC .... B33Y 80/00; B33Y 50/02; B29K 2091/00; B29K 2509/02; B29L 2011/00
See application file for complete search history.

(56) References Cited

U.S. PATENT DOCUMENTS

2019/0148603 A1* 5/2019 Lotito ................. F21K 9/64
   362/362
2020/0346398 A1* 11/2020 Guillemette ............. C08J 5/121

FOREIGN PATENT DOCUMENTS

| CN | 109004095 A | 12/2018 |
| CN | 110148676 A | 8/2019 |
| CN | 110299449 A | 10/2019 |
| CN | 110848040 A | 2/2020 |

\* cited by examiner

MANUFACTURING METHOD AND MANUFACTURING SYSTEM OF PEROVSKITE COLOR CONVERSION FILM

CROSS-REFERENCE TO RELATED APPLICATIONS

This application is the National Phase under 35 U.S.C. § 371 of International Application No. PCT/CN2019/122657, filed Dec. 3, 2019, which claims the benefit and priority to Chinese Patent Application No. 201911077927.4, filed on Nov. 6, 2019, and titled "MANUFACTURING METHOD AND MANUFACTURING SYSTEM OF PEROVSKITE COLOR CONVERSION FILM", the contents of which are incorporated in to the present disclosure.

BACKGROUND OF INVENTION

Field of Invention

The present disclosure relates to the field of display panel, and more particularly, to a manufacturing method and a manufacturing system of perovskite color conversion film.

Description of Prior Art

The description herein merely provided the background information related to the present disclosure, rather than constituting the prior art.

Organic-inorganic hybrid perovskite material is a compound having a formula of $ABX_3$. A represents monovalent cation, such as $CH_3NH_3^+$, $NH_2$—$CH$=$NH_2^+$, $Cs^+$; B represents bivalent cation, such as $Pb^{2+}$, $Sn^{2+}$; and X represents monovalent anion, such as $I^-$, $Br^-$, $Cl^-$. The perovskite material is popular in the field of optoelectronic application. The efficiency of solar battery using perovskite material as an absorption material is constantly refreshed, and the latest data achieves 24.2%. Therefore, the perovskite material becomes the most competitive material of next generation photovoltaic device. Due to high fluorescence quantum yield, continuously adjustable spectral range, and high color purity of the light-emitting diode manufactured by the perovskite material, the perovskite material has attracted widespread attention from scholars. Not only the perovskite material has great potential in the electroluminescent device mentioned above, but also the photoluminescence property of the perovskite material has great application in the display technology.

The perovskite material has currently caught the attention of the display industry, and it is expected to be applied to backlight films to improve the color gamut and other propertied of the display screens. Meanwhile, another important application of the perovskite material is color convention film, and the most common technology of the perovskite material is photolithography or inkjet printing. Among them, the photolithography has high cost, and requires expensive photomask in combination with yellow light process for implementation. Moreover, the usage rate of the perovskite material is low, and more raw materials may be rinsed off by the developing solution. Furthermore, the requirement of viscosity property of ink in the inkjet printing technology is very high, and the problems such as instability of continuous printing ink droplets and film shrinkage made afterwards often happens.

SUMMARY OF INVENTION

The present disclosure provides a method of manufacturing a perovskite color conversion film and a manufacturing system of perovskite color conversion film to manufacture a perovskite color conversion film by fused deposition modeling 3D printing technology. Thus, the present disclosure provides a method of manufacturing the perovskite color conversion with simple technology, easy operation, and high usage rate of raw material.

To solve the abovementioned technical problems, the solution provided by the present disclosure is shown as follows:

The present disclosure provides a method of manufacturing a perovskite color conversion film, comprising:
 manufacturing perovskite plastic wires:
 providing a substrate with areas to be printed; and
 heating and printing the plastic wires on the areas to be printed of the substrate by used of fused deposition modeling 3D printing technology, to formed a perovskite color conversion film.

In one embodiment, step of manufacturing perovskite plastic wires comprises:
 mixing perovskite powders with carrier particles, wherein a melting point of the carrier particle is lower than a melting point of the perovskite powders;
 heating the perovskite powders mixed with carrier particles, allowing the carrier particles to be melted to form molten carriers; and
 extruding a mixture of the molten carriers and the perovskite powders, to form the perovskite plastic wires.

In one embodiment, material of the carrier particles is polymer materials.

In one embodiment, the material of the carrier particles comprises ethylene wax.

In one embodiment, step of heating and printing the plastic wires on the areas to be printed of the substrate by used of fused deposition modeling 3D printing technology, to formed the perovskite color conversion film comprising:
 obtaining a preformed 3D model of the perovskite color conversion film;
 heating and melting the perovskite plastic wires; and
 printing the melted perovskite plastic wires on the areas to be printed of the substrate to form the perovskite color conversion film according to the 3D model of the perovskite color conversion film.

In one embodiment, step of printing the melted perovskite plastic wires on the areas to be printed of the substrate to form the perovskite color conversion film according to the 3D model of the perovskite color conversion film comprising:
 obtaining a shape and a height of the 3D model of the perovskite color conversion film;
 setting a thickness of a printing layer thickness, a number of printing layers, and a printing path according to the shape and the height of the 3D model of the perovskite color conversion film; and
 printing the melted perovskite plastic wires layer by layer on the areas to be printed of the substrate to form the perovskite color conversion film according to the printing layer thickness, printing layers, and printing path.

In one embodiment, heating temperature of the perovskite plastic wires ranges from 70° C. to 100° C.

In one embodiment, the areas to be printed comprises a plurality of subareas distributed in an array; and the perovskite color conversion film in each of the subareas comprises a red conversion film, a green conversion film, or a blue conversion film.

In one embodiment, the color of the perovskite color conversion film among each of the subareas is the same.

In one embodiment, material of the perovskite powders corresponding to the red conversion film comprises $CH_3NH_3Pb(Br/I)_3$ or $CsPb(Br/I)_3$; material of the perovskite powders corresponding to the green conversion film comprises $CH_3NH_3PbBr_3$ or $CsPbBr_3$; and material of the perovskite powders corresponding to the blue conversion film comprises $CH_3NH_3Pb(Br/Cl)_3$ or $CsPb(Br/Cl)_3$.

The embodiment of the present disclosure further provides a manufacturing system of perovskite color conversion film, comprising an extruding machine, a machine station, and a 3D printer; the extruding machine is used for manufacturing perovskite plastic wires, and providing the perovskite plastic wires to the 3D printer; the machine station is used for supporting a substrate with areas to be printed; and the 3D printer is placed on one side of the substrate away from the machine station, and is used for heating and printing the plastic wires on the areas to be printed of the substrate by used of fused deposition modeling 3D printing technology, to form perovskite color conversion film.

In one embodiment, the 3D printer comprises a feeding device, heating device, and a nozzle head, wherein the heating device is placed between the feeding device and the nozzle head, and wherein the nozzle head is placed above the machine station.

In one embodiment, the manufacturing system of perovskite color conversion film further comprises a controlling unit, wherein the controlling unit is connected to the 3D printer, and is used for setting printing parameters of the 3D printer.

In one embodiment, the printing parameters comprise printing layer thickness, printing layers, and printing path.

In one embodiment, the printing parameters further comprise printing rate of the nozzle head, heating temperature of the heating device, and distance between the nozzle head and the substrate.

In one embodiment, manufacturing method of the perovskite plastic wires comprises:

placing perovskite powders and carrier particles in the extruding machine and mixing; wherein a melting point of the carrier particle is lower than a melting point of the perovskite powders;

heating the perovskite powders mixed with carrier particles, allowing the carrier particles to be melted to form molten carriers; and extruding a mixture of the molten carriers and the perovskite powders by the extruding machine, to form the perovskite plastic wires.

In one embodiment, material of the carrier particles is polymer materials.

In one embodiment, the material of the carrier particles comprises ethylene wax.

In one embodiment, the perovskite color conversion film comprises red conversion film, green conversion film, or blue conversion film.

In one embodiment, material of the perovskite powders corresponding to the red conversion film comprises $CH_3NH_3Pb(Br/I)_3$ or $CsPb(Br/I)_3$; material of the perovskite powders corresponding to the green conversion film comprises $CH_3NH_3PbBr_3$ or $CsPbBr_3$; and material of the perovskite powders corresponding to the blue conversion film comprises $CH_3NH_3Pb(Br/Cl)_3$ or $CsPb(Br/Cl)_3$.

The beneficial effects of the present disclosure are that using fused deposition modeling 3D printing technology for manufacturing the perovskite color conversion film has properties of simple technology, easy operation, and high usage rate of raw material.

BRIEF DESCRIPTION OF DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from those skilled persons in the art based on these drawings without paying any creative effort.

DETAILED DESCRIPTION OF PREFERRED EMBODIMENTS

Figure 1:
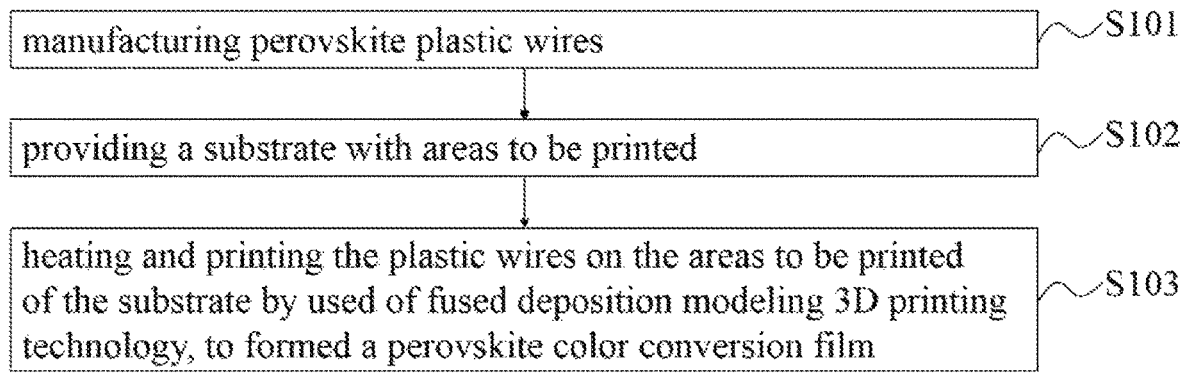
FIG. 1 is a schematic view of a manufacturing method of perovskite color conversion film according to one embodiment of the present invention.

The specific structure and detail function disclosed herein are merely represented, and the purpose thereof is used to describe the exemplary embodiment. However, the present disclosure may be implemented through multiple alternative forms, which may not be construed as being limited to the embodiments described herein.

The description of each of the following embodiments is provided with reference to the appending drawings to exemplify the specific embodiment that may be implemented. The terms, such as "center," "horizontal," "upper," "lower," "left," "right," "vertical," "level," "top," "bottom," "inside," "outside," are based on the orientation or positional relationship shown in the drawings, and the terms are merely for convenience of description of the present invention, and thus they are not to be construed as limiting. Moreover, terms "the first," "the second," are used to describe the objective, rather than construing as indicating or implying the relative importance or implying the amount of indicated technical features. As such, limited features of "the first," "the second," may indicated or imply comprise one or more technical features. In the description of the present application, unless otherwise indicated, "a plurality of" means two or more than two. Furthermore, the term "comprise" and any synonym intends to cover containing without exclusive.

In the description of the present application, it should be noted that, unless otherwise specified and limited, terms "mounting," "conjunction," "connecting," should be interpret broadly. For example, those may be fixed connection, may also be detached connection, or integrally connection; may be mechanical connection, and may also be electrical connection; may be direct connection, and may also be indirect connected via intermediary, and may be intercommunicated within two elements. A skilled person in the art may comprehensive the specific meaning of the above terms in the present disclosure.

The terms described herein are merely used to describe the specific embodiment, rather than intending to limit the exemplary embodiment. Unless the context clearly indicates otherwise, the singular "one," "one item" used herein intend to comprise plurality. It should also be understood that the terms "comprise," and/or "contain" used herein specify the existence of stated features, integers, steps, operations, units, elements, and/or combination thereof, without excluding the existence or addition one or more other features, integers, steps, operations, units, elements, and/or combination thereof.

Following embodiments in combination with drawings are used to further explain the present disclosure.

Referring to FIG. 1, the embodiment of the present disclosure provides a manufacturing method of perovskite color conversion film, comprising:

S101: manufacturing perovskite plastic wires.

Specifically, the step S101 comprises:

mixing perovskite powders with carrier particles; in one embodiment, a melting point of the carrier particle is lower than a melting point of the perovskite powders, the carrier particles is polymer materials, and specifically may be ethylene wax;

heating the perovskite powders mixed with carrier particles, allowing the carrier particles to be melted to form molten carriers; and extruding a mixture of the molten carriers and the perovskite powders, to form the perovskite plastic wires.

Specifically, in a process of manufacturing perovskite powders, the perovskite powders are pre-mixed with carrier particles, and molten carriers and the perovskite powder need to be further mixed well before the step of extruding the mixtures of the molten carriers and the perovskite powders to form the perovskite plastic wires.

S102: Providing a substrate with areas to be printed.

Figure 2:
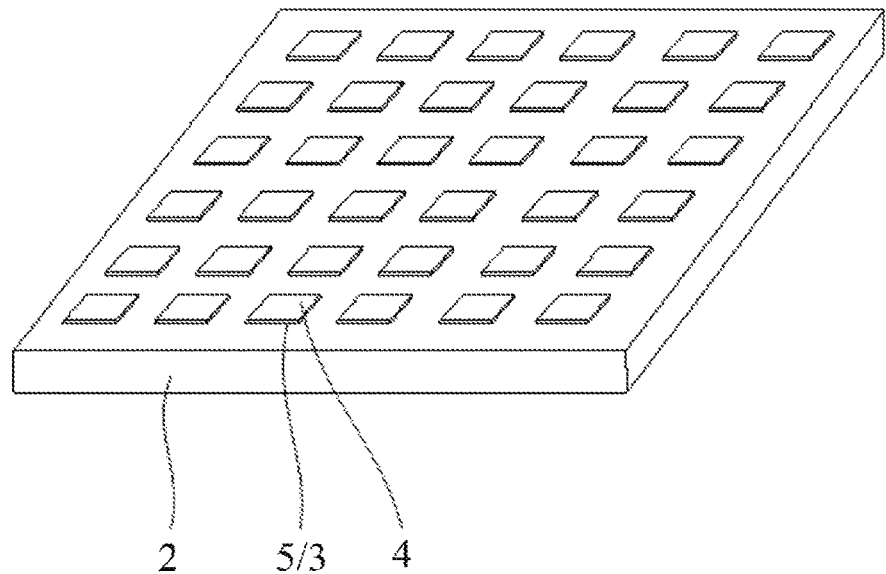
FIG. 2 is a schematic view of the perovskite color conversion film and a substrate according to one embodiment of the present invention.

Specifically, referring to FIG. 2, the range 3 to be printed is disposed on the substrate 2, and the range 3 to be printed comprise a plurality of subareas 5 distributed in an array.

S103: Heating and printing the plastic wires on the areas to be printed of the substrate by used of fused deposition modeling 3D printing technology, to formed a perovskite color conversion film.

Specifically, the step S103 comprises:

obtaining a preformed 3D model of perovskite color conversion film, and obtaining shape and height of the 3D model of perovskite color conversion film;

heating and melting the perovskite plastic wires; in one embodiment, heating temperature of the perovskite plastic wires is from 70° C. to 100° C.;

setting printing layer thickness, printing layers, and printing path according to the 3D model of perovskite color conversion film; and printing the melted perovskite plastic wires layer by layer on the areas to be printed of the substrate to form the perovskite color conversion film according to the printing layer thickness, printing layers, and printing path.

Specifically, referring to FIG. 2, the perovskite color conversion film 4 is formed on the range 3 to be printed of the substrate 2.

In the present embodiment, using fused deposition modeling 3D printing technology for manufacturing the perovskite color conversion film has properties of simple technology, easy operation, and high usage rate of raw material. Moreover, the perovskite plastic wires using polymer material with the melting point lower than the perovskite powders provides the benefit of ensuring thermal stability of the perovskite material used during the manufacturing process of the perovskite plastic wires, and ensuring the better properties of the formed perovskite color conversion film.

Figure 3:
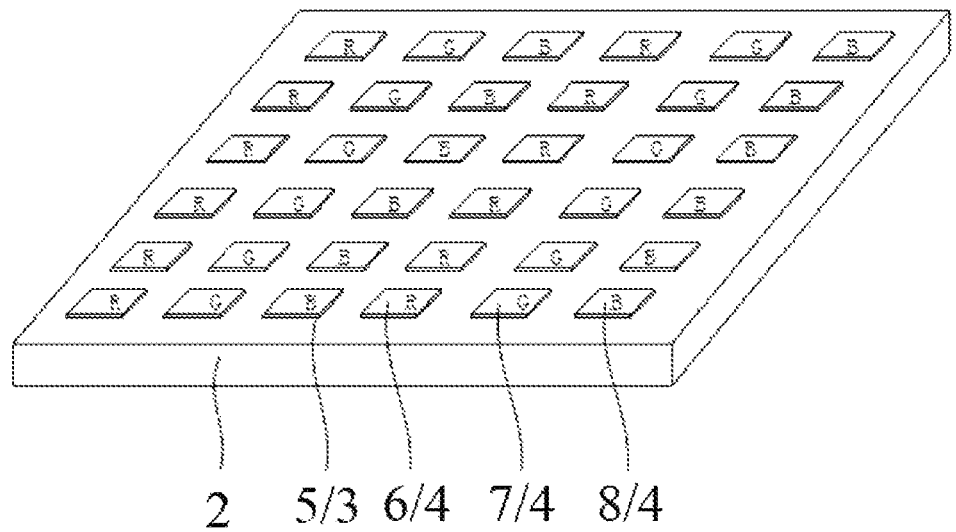
FIG. 3 is a schematic view of another perovskite color conversion film and a substrate according to one embodiment of the present invention.

In one embodiment, referring to FIG. 2 and FIG. 3, the areas 3 to be printed comprises a plurality of subareas 5 distributed in an array. The perovskite color conversion film 4 among each of the subareas 5 comprises red conversion film 6, green conversion film 7, or blue conversion film 8. In one embodiment, the red conversion film 6 may be excited to generate red light, the green conversion film 7 may be excited to generate green light, and the blue conversion film 8 may be excited to generate blue light. Moreover, material of the perovskite powders corresponding to the red conversion film 6 comprises $CH_3NH_3Pb(Br/I)_3$ or $CsPb(Br/I)_3$; material of the perovskite powders corresponding to the green conversion film 7 comprises $CH_3NH_3PbBr_3$ or $CsPbBr_3$; and material of the perovskite powders corresponding to the blue conversion film 8 comprises $CH_3NH_3Pb(Br/Cl)_3$ or $CsPb(Br/Cl)_3$.

Specifically, unicolor (containing red R, green G, or blue B) of the perovskite color conversion film 4, and full-color (containing red R, green G, or blue B) of the perovskite color conversion film 4 may be printed based on needs. Types of the perovskite color conversion film 4 to be formed are dependent on the material of the perovskite powders of the perovskite plastic wires. For the unicolor of the perovskite color conversion film 4, one kind of material of the perovskite plastic wires is used during the whole printing process. Specifically, each of the subarea 5 may only contain the red conversion film 6, and the perovskite powders of the perovskite plastic wires used during printing are $CH_3NH_3Pb(Br/I)_3$ or $CsPb(Br/I)_3$. Alternatively, each of the subarea 5 may only contain the green conversion film 7, and the perovskite powders of the perovskite plastic wires used during printing are $CH_3NH_3PbBr_3$ or $CsPbBr_3$. Of course, each of the subarea 5 may only contain the blue conversion film 8, and the perovskite powders of the perovskite plastic wires used during printing are $CH_3NH_3Pb(Br/Cl)_3$ or $CsPb(Br/Cl)_3$. Furthermore, for the full-color perovskite color conversion film 4, thicolor of RGB perovskite color conversion film 4 may be obtained by used of different corresponding perovskite plastic wires 1 based on color requirements of different subareas 5.

In the present embodiment, different colors of the perovskite color conversion film corresponding to different colors of the perovskite plastic wires may be formed by use of fused deposition modeling 3D printing technology. It is beneficial to manufacture products with different emitted colors, and it has advantages of simple technology, easy operation, and high usage rate of raw material.

Figure 4:
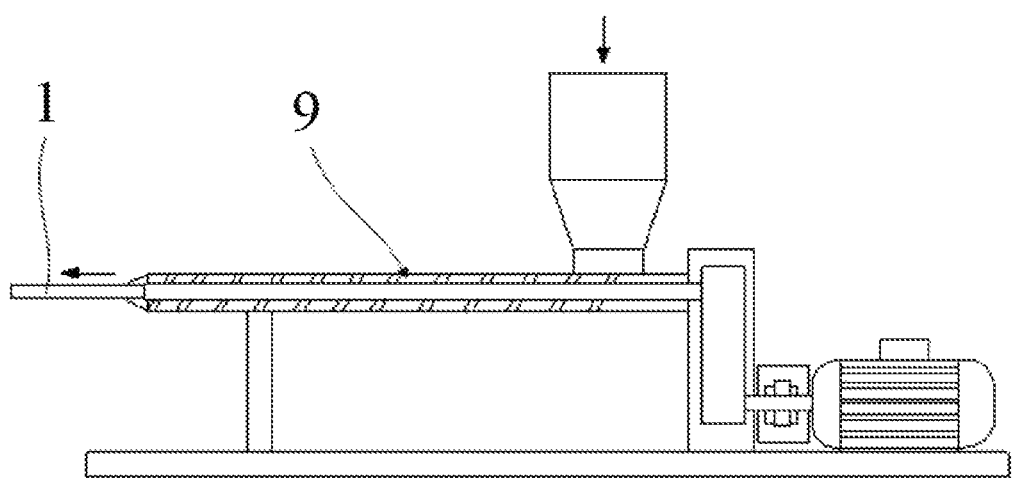
FIG. 4 is a schematic view of an extruding machine according to one embodiment of the present invention.
Figure 5:
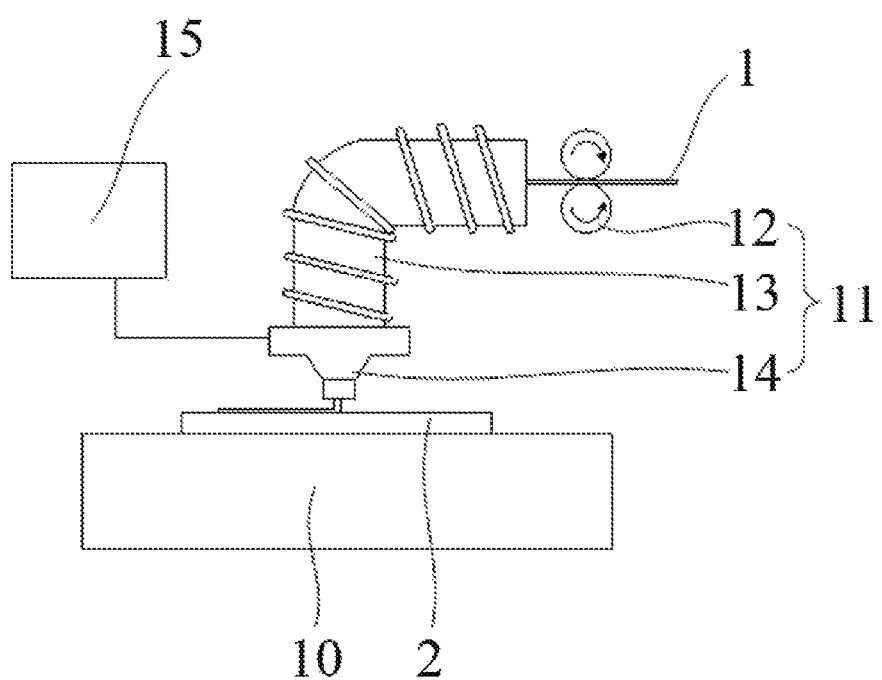
FIG. 5 is a schematic view of a 3D printer according to one embodiment of the present invention.

Referring to FIG. 4 and FIG. 5, the embodiment of the present disclosure further provides a manufacturing system of perovskite color conversion film, which comprises an extruding machine 9, a machine station 10, and a 3D printer 11. In one embodiment, the extruding machine 9 is used for manufacturing perovskite plastic wires 1, and providing the perovskite plastic wires 1 to the 3D printer 11. The machine station 10 is used for supporting a substrate 2 with areas 3 to be printed. The 3D printer 11 is placed on one side of the substrate 2 away from the machine station 10, and is used for heating and printing the plastic wires 1 on the areas 3 to be printed of the substrate 2 by used of fused deposition modeling 3D printing technology, to form perovskite color conversion film 4.

Specifically, the 3D printer 11 comprises a feeding device 12, heating device 13, and a nozzle head 14. The heating device 13 is placed between the feeding device 12 and the nozzle head 14, and the nozzle head 14 is placed above the machine station 10. In one embodiment, the perovskite plastic wires 1 is added into the heating device 13 through the feeding device 12, followed by entering into the nozzle head 14 after heating and melting by the heating device 13.

The perovskite plastic wires 1 is printed on the areas 3 to be printed of the substrate 2 placed on the machine station 10.

Specifically, the manufacturing system of perovskite color conversion film further comprises a controlling unit 15. The controlling unit 15 is connected to the 3D printer 11, and is used for setting printing parameters of the 3D printer 11. In one embodiment, the printing parameters comprise printing layer thickness (layer thickness of monolayer), printing layers and printing path of the nozzle head 14, heating temperature of the heating device 13, and distance between the nozzle head 14 and the substrate 2.

Specifically, the process of manufacturing the perovskite color conversion film 4 by the manufacturing system of perovskite color conversion film comprises:

obtaining shape and height of the 3D model of perovskite color conversion film by use of the 3D model of perovskite color conversion film established by 3D modeling software;

feeding the perovskite powders and the carrier particles into the extruding machine for pre-mixing, melting the carrier particles by heating, mixing the molten carriers and the perovskite powders well with a screw of the extruding machine, and finally excluding to obtain the perovskite plastic wires 1 which is then provided to the feeding device 12 of the 3D printer 11;

disposing the substrate 2 with the area 3 to be printed on the machine station 10 place below the nozzle head 14;

setting printing parameters of the 3D printer 11 through the controlling unit 15 according to shape and height of the 3D model of perovskite color conversion film; in one embodiment, the printing parameters contain printing layer thickness, printing layers, printing path, printing rate, heating temperature (temperature range of between 70° C. and 100° C.), and distance between the nozzle head 4 and the substrate 2; and starting the 3D printer 11, and specifically printing the heated perovskite plastic wires 1 layer by layer on the area 3 to be printed of the substrate 2 by the printing actions of the nozzle head 14, to form the perovskite color conversion film 4.

Specifically, during the printing process, the nozzle head 14 is ascended a height of one printing layer thickness or dropped a height of one printing layer thickness to adjust the distance between the nozzle head 14 and the substrate 2.

In the present embodiment, using fused deposition modeling 3D printing technology for manufacturing the perovskite color conversion film has properties of simple technology, easy operation, and high usage rate of raw material.

In the above, the present disclosure has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing a perovskite color conversion film, comprising:
   manufacturing perovskite plastic wires;
   providing a substrate with areas to be printed; and
   heating and printing the perovskite plastic wires on the areas to be printed of the substrate by using fused deposition modeling 3D printing technology, to form the perovskite color conversion film;
   wherein the step of manufacturing the perovskite plastic wires comprises:
   mixing perovskite powders with carrier particles, wherein a melting point of the carrier particles is lower than a melting point of the perovskite powders;
   heating the perovskite powders mixed with the carrier particles, allowing the carrier particles to be melted to form molten carriers; and
   extruding a mixture of the molten carriers and the perovskite powders, to form the perovskite plastic wires.

2. The method of manufacturing the perovskite color conversion film according to claim 1, wherein material of the carrier particles is polymer materials.

3. The method of manufacturing the perovskite color conversion film according to claim 2, wherein the material of the carrier particles comprises ethylene wax.

4. The method of manufacturing the perovskite color conversion film according to claim 1, wherein the step of heating and printing the perovskite plastic wires on the areas to be printed of the substrate by using fused deposition modeling 3D printing technology, to form the perovskite color conversion film comprises:
   obtaining a preformed 3D model of the perovskite color conversion film;
   heating and melting the perovskite plastic wires; and
   printing the melted perovskite plastic wires on the areas to be printed of the substrate to form the perovskite color conversion film according to the preformed 3D model of the perovskite color conversion film.

5. The method of manufacturing the perovskite color conversion film according to claim 4, wherein the step of printing the melted perovskite plastic wires on the areas to be printed of the substrate to form the perovskite color conversion film according to the preformed 3D model of the perovskite color conversion film comprises:
   obtaining a shape and a height of the preformed 3D model of the perovskite color conversion film;
   setting a thickness of a printing layer, a number of printing layers, and a printing path according to the shape and the height of the preformed 3D model of the perovskite color conversion film; and
   printing the melted perovskite plastic wires layer by layer on the areas to be printed of the substrate to form the perovskite color conversion film according to the thickness of the printing layer, the number of printing layers, and the printing path.

6. The method of manufacturing the perovskite color conversion film according to claim 4, wherein heating temperature of the perovskite plastic wires ranges from 70° C. to 100° C.

7. The method of manufacturing the perovskite color conversion film according to claim 1, wherein the areas to be printed comprise a plurality of subareas distributed in an array; and the perovskite color conversion film in each of the subareas comprises a red conversion film, a green conversion film, or a blue conversion film.

8. The method of manufacturing the perovskite color conversion film according to claim 7, wherein color of the perovskite color conversion film among each of the subareas is the same.

9. The method of manufacturing the perovskite color conversion film according to claim 7, wherein material of the perovskite powders corresponding to the red conversion film comprises $CH_3NH_3Pb(Br/I)_3$ or $CsPb(Br/I)_3$; material of the perovskite powders corresponding to the green conversion film comprises $CH_3NH_3PbBr_3$ or $CsPbBr_3$; and material of the perovskite powders corresponding to the blue conversion film comprises $CH_3NH_3Pb(Br/Cl)_3$ or $CsPb(Br/Cl)_3$.

\* \* \* \* \*